(12) United States Patent
Leung

(10) Patent No.: US 6,732,308 B1
(45) Date of Patent: May 4, 2004

(54) INTEGRATION OF EMBEDDED AND TEST MODE TIMER

(75) Inventor: Vincent C. Leung, Mountain View, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 541 days.

(21) Appl. No.: 09/664,819

(22) Filed: Sep. 19, 2000

Related U.S. Application Data

(60) Provisional application No. 60/185,955, filed on Feb. 29, 2000.

(51) Int. Cl.[7] .................... G01R 31/28; G11C 16/04; G06F 12/00
(52) U.S. Cl. ............... 714/724; 365/185.33; 711/103
(58) Field of Search ................... 714/718, 724; 365/185, 33; 711/103

(56) References Cited

U.S. PATENT DOCUMENTS

| | | | |
|---|---|---|---|
| 5,636,166 A | * 6/1997 | Roohparvar | 365/194 |
| 5,729,169 A | * 3/1998 | Roohparvar | 327/227 |
| 5,890,193 A | * 3/1999 | Chevallier | 711/103 |
| 6,081,870 A | * 6/2000 | Roohparvar | 711/103 |

* cited by examiner

Primary Examiner—Albert Decady
Assistant Examiner—Matthew C. Dooley

(57) ABSTRACT

The present invention discloses an embedded and test mode timer circuit that is used to perform operations in an embedded mode and a plurality of test modes in a memory device. When the memory device is operating in the embedded mode, the embedded and test mode timer circuit is activated to automatically direct at least one logic circuit to execute logic tasks at predetermined times. When the memory device is operating in a test mode, the embedded and test mode timer circuit is activated to automatically direct a portion of the logic circuits to execute logic tasks at predetermined times and the remaining portion of the logic circuit are manually directed.

20 Claims, 2 Drawing Sheets

INTEGRATION OF EMBEDDED AND TEST MODE TIMER

This application claims the benefit under 35 U.S.C. §19(e) of Provisional U.S. patent application Ser. No. 60/185,955, filed on Feb. 29, 2000.

FIELD OF INVENTION

The present invention relates generally to non-volatile memory devices and, more particularly, to a timing system and method for embedded and test modes within flash electrically erasable programmable read-only memory (EEPROM) devices.

BACKGROUND OF THE INVENTION

A flash memory is a storage device that is capable of retaining stored information in the absence of continuous power. The information is stored in a plurality of flash transistors that are electrically connected and formed on a silicone substrate. A flash transistor is typically referred to as a memory cell and includes a source, a drain, a floating gate and a control gate. Flash memory are formed by rows and columns of memory cells that form a memory array. The memory array is typically a matrix where the control gates of the memory cells in a row are electrically connected to form a respective wordline and the drains of the memory cells in a column are electrically connected to form a respective bitline. Generally, the sources of the memory cells are electrically connected to form a common source line.

To perform a read, program or erase of memory cells in the memory array, a respective predetermined voltage is applied to the wordlines, bitlines and source lines of the memory cells. In addition to the read, program and erase, other typical operations performed on the memory cells are a program verify and an erase verify. The program verify ensures that the memory cells have been properly programmed and the erase verify ensures that the memory cells have been properly erased. If memory cells are not properly programmed or erased, corrective actions are taken by the flash memory to achieve the desired programmed or erased state.

The process of reading, programming, program verifying, erasing or erase verifying memory cells in the flash memory are typical operations that involve a number of logic tasks. The logic tasks can be performed in what is known by those skilled in the art as an embedded mode in the flash memory. In the embedded mode, the logic tasks associated with an operation are automated such that once the operation is initiated the logic tasks will be executed automatically in a synchronized fashion by the flash memory.

In addition to the embedded mode, the flash memory typically also includes a plurality of test modes where the read, program, program verify, erase and erase verify operations are performed during testing of the flash memory. Prior art systems and methods of performing an operation in the test modes involves manual application of externally supplied control signals to execute the logic tasks. Since the timing of some of the logic tasks is critical or must occur very quickly, known problems can occur unless the testing is done using expensive and sophisticated test equipment.

Prior art testing is very complex and requires that the test equipment is programmed to maintain the timing and synchronization of the logic tasks during the operations. The test equipment is also required to supply predetermined magnitudes of control signals to the flash memory. In addition, a change to the operations in the embedded mode of the flash memory typically requires changes to the programming and control voltages of the test equipment.

For the foregoing reasons, a need exists for memory devices that can perform operations in both the embedded mode and test modes without the use of expensive and sophisticated test equipment.

SUMMARY OF THE INVENTION

The present invention discloses a memory device that includes an embedded and test mode timer circuit to perform operations in both the embedded mode and a plurality of test modes. The preferred memory device is a flash memory and includes a state machine electrically connected with an embedded and test mode timer circuit. The embedded and test mode timer circuit and the state machine are also electrically connected with at least one logic circuit. As known in the art, the state machines are used to control the overall operation of the flash memory in response to instruction sets that are received by the state machine.

During an embedded mode in the preferred embodiment, the state machine receives instruction sets and activates the embedded and test mode timer circuit. As known in the art, the embedded mode is a mode that allows automated operation of the flash memory. The embedded and test mode timer circuit is activated to automatically direct the logic circuits to execute an operation such as a read, program, program verify, erase or erase verify based on a plurality of predetermined times. During a plurality of test modes, the state machine activates the embedded and test mode timer circuit to automatically direct a portion of the logic circuits at predetermined times and manually direct the remaining logic circuits.

The preferred embedded and test mode timer circuit includes a timer electrically connected with a plurality of decoders that are in turn electrically connected with at least one flip-flop. The flip-flops are electrically connected with the logic circuits. During the embedded mode, when the state machine receives instructions to perform an operation, the state machine activates the timer and a portion of the decoders. The portion of the decoders activated is a decoder group that is associated with, and controls, the operation to be performed. The timer generates and directs a plurality of predetermined times to the decoders. As the timer counts sequentially, the decoders in the decoder group monitor the timer and generate a plurality of control output signals that are directed to the flip-flops when a respective predetermined time is reached. The control output signal from each decoder in the decoder group activates the flip-flops to direct the logic circuits to perform a plurality of logic tasks to complete the operation.

When an operation such as a program, a program verify, an erase, an erase verify or a read is performed during a test mode, the state machine activates the embedded and test mode timer circuit to direct the logic circuits. The timer and the same decoder group that are associated with the operation in the embedded mode are activated. However, in the test mode, the timer and decoder group does not control all the logic circuits associated with the operation. The timer and the decoder group activate the flip-flops to direct a portion of the logic circuits and the remaining logic circuits are manually controlled. Effectively, the logic circuits for the test mode operation are split into three groups: 1) those logic circuits that are automatically directed to execute logic tasks at the beginning of the operation; 2) those logic circuits that are manually directed to execute logic tasks in the middle of the operation; and 3) those logic circuits that are automatically directed to execute logic tasks at the end of the operation. As would be recognized by those skilled in the art, the nature and number of logic tasks in each respective group are dependent on the particular operation within the test mode.

The state machine manually controls the logic circuits by activating the flip-flops within the embedded and test mode timer circuit to direct the logic circuits based on user control inputs to the flash memory. When the operation is initiated in the test mode, the logic circuits are directed by the timer, the decoder group and the flip-flops to automatically execute the logic tasks at the beginning of the operation based on the predetermined times generated by the timer. The logic circuits that include the logic tasks in the middle of the operation are no longer automated since the respective decoders are disabled and the operation is effectively suspended until they are completed manually. The user manually activates the flip-flops in the embedded and test mode timer circuit to direct the logic circuits to execute the logic tasks in the middle of the operation. Following completion of the logic tasks in the middle of the operation, the logic circuits are automatically directed to execute the logic tasks at the end of the operation by the timer, the decoder group and the flip-flops.

Those skilled in the art recognize that determining which logic tasks are placed in manual user control and which logic tasks remain automated by the timer as in the embedded mode is dependent on the operation being performed during the test mode. In addition, the decision of which logic tasks within a particular test mode operation are to be placed in manual control is dependent on what types of tests are to be performed.

Another preferred embodiment of the present invention, is a method of executing an operation in an embedded mode and in a plurality of test modes in a memory device that in the preferred embodiment is a flash memory. The operation is initiated with a state machine. The state machine then activates an embedded and test mode timer circuit to execute the operation. The embedded and test mode timer directs a plurality of logic circuits to complete the operation in both the embedded mode and the test modes in the same manner as in the previously set forth embodiments.

Presently known prior art memory timing architectures use timers for operations performed in the embedded mode and manually control operations in the test mode using expensive and sophisticated test equipment. The preferred embodiment of the present invention utilizes the timer and the same decoder group for an operation in either the embedded mode or the test mode. Since the test mode operation is performed using the embedded and test mode timer circuit and the state machine, the complexity of testing is greatly reduced thus avoiding the use of expensive and sophisticated test equipment.

In the preferred embodiment, the timing for the logic tasks where timing is critical, or must occur very quickly, is the same in both the embedded mode and during the test modes. Since the timing is the same, changes to the flash memory that affect the operation in the embedded mode also affect the operation in the test modes. In addition, since the critical timing is accomplished with the timer and decoders, manual direction of the logic circuits with the embedded and test mode timer circuit and the state machine can be accomplished with simple test equipment.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the invention are set forth below with reference to specific configurations, and those skilled in the art would recognize that various changes and modifications could be made to the specific configurations while remaining within the scope of the claims. The invention may be used with any type of memory device that operates in an embedded mode and a plurality of test modes; however, the preferred embodiment of the invention is designed for flash memory.

Figure 1:
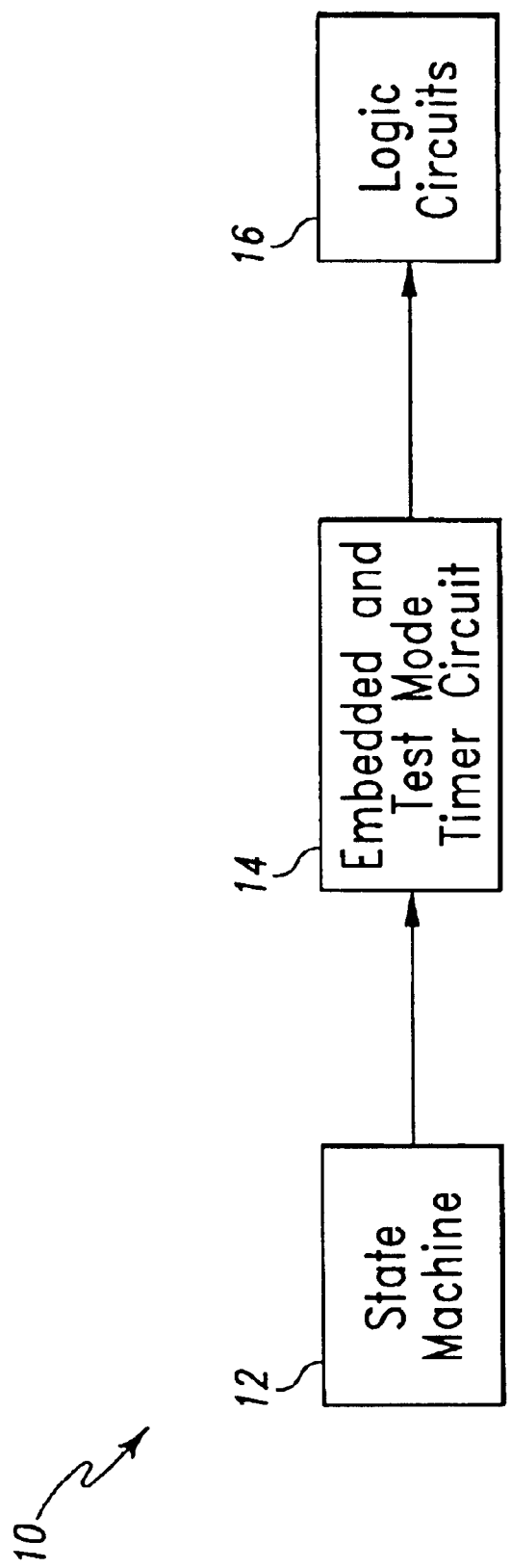
FIG. 1 is a block diagram of a portion of a flash memory incorporating a preferred embodiment of an embedded and test mode timer circuit.

FIG. 1 illustrates a block diagram of a portion of a flash memory 10 incorporating an embodiment of the present invention. The preferred flash memory 10 includes a state machine 12, an embedded and test mode timer circuit 14, and at least one logic circuit 16. The state machine 12 is electrically connected with the embedded and test mode timer circuit 14. The embedded and test mode timer circuit 14 is electrically connected with the logic circuits 16.

As it relates to the present invention, the preferred flash memory 10 can be operated in either an embedded mode or in a plurality of test modes. The embedded mode is considered the operating mode of the flash memory 10 and the test modes are entered when diagnostics and testing of particular operations within the flash memory 10 is desired. As known in the art, embedded mode allows automated operation of the flash memory 10.

When the flash memory 10 is operated in the embedded mode, the state machine 12 receives instruction sets to perform an operation such as a read, program, program verify, erase or erase verify. As known in the art, state machines are used to control the overall operation of the flash memory 10 in response to instruction sets that are received by the state machine. For purposes of the present invention, it is only necessary for those skilled in the art to understand that the state machine 12 responds to externally controlled instruction sets and generates predetermined electric signals that are control outputs to perform operations within the flash memory 10. Those skilled in the art would recognize that many operations are performed within the flash memory and that the operations set forth are for illustrative purposes only and should not be construed as limitations on the present invention.

The state machine 12 generates and directs predetermined electric signals to activate the embedded and test mode timer circuit 14 to direct the operation in the embedded mode. The embedded and test mode timer circuit 14 automatically directs the logic circuits 16 associated with the operation to execute a plurality of logic tasks at a plurality of predetermined times. Those skilled in the art would recognize that the logic tasks are performed by the logic circuits 16 to complete the operation. When the logic tasks are complete, the operation has been completed and the state machine 12 deactivates the embedded and test mode timer circuit 14.

When the flash memory 10 is operated in one of the test modes, the state machine 12 receives instruction sets to enter a test mode and perform an operation such as read, program, program verify, erase or erase verify. The embedded and test mode timer circuit 14 is again activated to direct the logic circuits 16 in the test mode. However, the embedded and test mode timer circuit 14 only controls a portion of the logic circuits 16 associated with the particular operation to automatically execute associated logic tasks based on a plurality of predetermined times. The remaining logic circuits 16 are manually controlled by the state machine 12 based on externally controlled instruction sets from the user.

The same logic circuits 16 perform the operation in the embedded mode and in the test mode as directed by the embedded and test mode timer circuit 14. The difference between an operation in the embedded mode and the occurrence of the same operation in the test mode is that in the embedded mode, the logic circuits 16 execute automatically to complete the operation. In the test mode, some of the logic circuits 16 execute automatically and some of the logic circuits 16 are under manual control.

Figure 2:
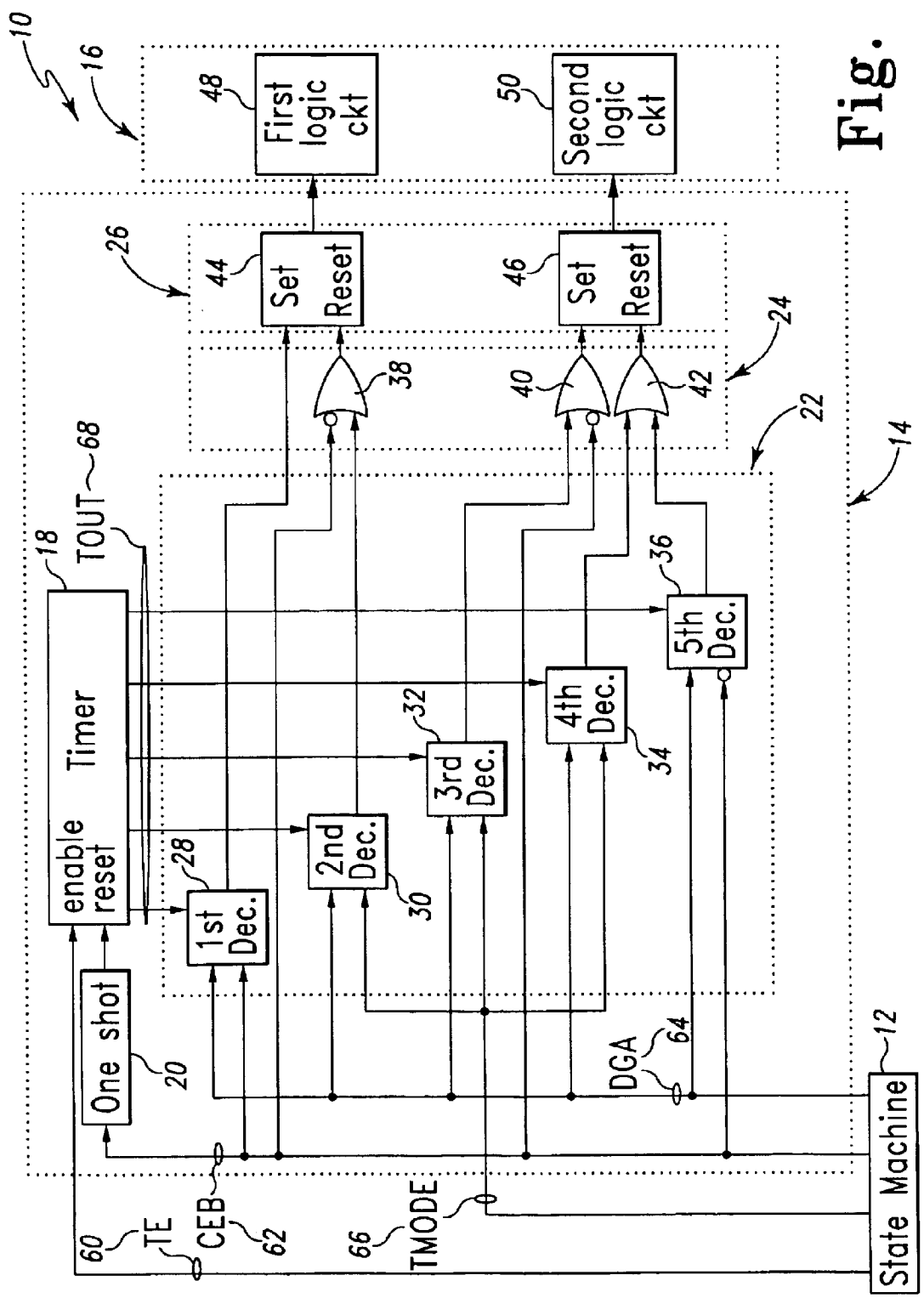
FIG. 2 is the block diagram of FIG. 1 with the addition of a detailed block diagram of the preferred embedded and test mode timer circuit and the preferred logic circuits.

FIG. 2 illustrates the block diagram of FIG. 1 with the addition of an expanded block diagram of the embedded and test mode timer circuit 14 and the logic circuits 16. The preferred embedded and test mode timer circuit 14 includes a timer 18, a one shot 20, a decoder group 22, a NOR gate group 24 and a flip flop group 26. The decoder group 22 includes at least one decoder and in the preferred embodiment includes a first decoder 28, a second decoder 30, a third decoder 32, a fourth decoder 34, and a fifth decoder 36. The NOR gate group 24 includes at least one NOR gate and in the preferred embodiment includes a first NOR gate 38, a second NOR gate 40 and a third NOR gate 42. The flip-flop group 26 includes at least one flip-flop and in the preferred embodiment includes a first flip-flop 44 and a second flip-flop 46. The logic circuits 16 include a first logic circuit 48 and a second logic circuit 50.

As illustrated in FIG. 2, the state machine 12 is electrically connected with the timer 18 by a timer enable line (TE) 60. The state machine 12 is also electrically connected with the one shot 20, the first decoder 28, the fifth decoder 36, the first NOR gate 38 and the second NOR gate 40 by a control enable bar line (CEB) 62. A decoder group activation line (DGA) 64 electrically connects the state machine 12 with the first decoder 28, the second decoder 30, the third decoder 32, the fourth decoder 34 and the fifth decoder 36. The state machine is also electrically connected with the second, third and fourth decoder (30, 32, 34) by a test mode line (TMODE) 66. The first, second, third, fourth and fifth decoders (28, 30, 32, 34, 36) respectively are electrically connected with the timer 18 by a timer output line (TOUT) 68.

The timer 18 is also electrically connected with the one shot 20. The first decoder 28 is electrically connected with the first flip-flop 44. The second decoder 30, the third decoder 32 and the fourth decoder 34 are electrically connected with the first NOR gate 38, the second NOR gate 40 and the third NOR gate 42, respectively. The fifth decoder 36 is also electrically connected with the third NOR gate 42. The first flip-flop 44 is electrically connected with the first NOR gate 38 and the first logic circuit 48 of the logic circuits 16. The second flip-flop 46 is electrically connected with the second NOR gate 40, the third NOR gate 42 and the second logic circuit 50.

The preferred embedded and test mode timer circuit 14 operates automatically when activated in the embedded mode based on the predetermined times generated by the timer 18. The timer 18 is activated by a predetermined electric signal generated by the state machine 12 on the timer enable line (TE) 60. The timer 18 is reset to a predetermined time by a predetermined electric signal generated from the one shot 20.

The one shot 20 is activated on the rising and falling edge of a predetermined electric signal generated by the state machine 12 on the control enable bar line (CEB) 62. The electrical configuration and operation of one shots is known in the art and a detailed discussion of the circuit configuration and operation is not necessary for the present invention. The timer 18 in the preferred embodiment is a binary counter but, as known in the art, could be any device capable of counting time and generating a plurality of predetermined electric signals to activate the decoder group 22.

In the preferred embodiment, the first and fifth decoders 28, 36 are enabled by conducting electric signals on the control enable bar line (CEB) 62. The second, third and fourth decoders (30, 32, 34) are enabled by conducting electric signals on the test mode line (TMODE) 66. In addition, the first, second, third, fourth and fifth decoders (28, 30, 32, 34, 36) are activated as group by a conducting electric signal on the decoder group activation line (DGA) 64.

As known in the art, decoders are a circuit that is a fundamental component of any memory device. Once enabled, decoders are used to generate an electric signal to activate/deactivate a selected device if electric signals received by the decoder equal a predetermined set of values. For purposes of the present invention, those skilled in the art would recognize that several decoder circuits exist that can receive the predetermined times from the timer 18 and generate predetermined electric signals as control output signals to operate the first and second flip-flops (44, 46).

The first and second flip-flops (44, 46) are capable of being set to generate a conducting electric signal and reset to generate a non-conducting electric signal by the control output signals from the decoders (28, 30, 32, 34, 36) and the state machine 12. Those skilled in the art would recognize that flip-flops are well known in the art and a detail discussion of operation is unnecessary. The predetermined electric signal generated by the first and second flip-flops (44, 46) activates and deactivates the first logic circuit 48 and the second logic circuit 50 of the preferred embodiment to execute the logic tasks.

Those skilled in the art recognize that the first and second logic circuits (48, 50) can take many forms and that the function and operation of the logic circuits (48, 50) are dependent on the logic tasks that are performed as part of the respective operation. For purposes of the present invention, it is only necessary for those skilled in the art to understand that the first and second logic circuits (48, 50) are activated and deactivated during a respective operation by the predetermined electric signals generated by the first and second flip-flops (44, 46).

During operation in the preferred embodiment, when an embedded mode operation is initiated, the state machine 12 receives instruction sets and begins conducting an electric signal on the decoder group activation line (DGA) 64, the control enable bar line (CEB) 62, and the timer enable line (TE) 60. In addition, an electric signal from the state machine 12 on the timer mode line (TMODE) 66 that was previously conducting continues conducting. The electric signal on the decoder group activation line (DGA) 64 activates the decoder group 22 that is specific to the respective operation to be performed.

In addition, the timer 18 is reset by the one shot 20, the first decoder 28 is enabled and the fifth decoder 36 is disabled by the electric signal on the control enable bar line (CEB) 62. The second decoder 30, the third decoder 32 and the fourth decoder 34 remain enabled by the electric signal on the test mode line (TMODE) 66. The timer 18 is activated by the electric signal on the timer enable line (TE) 60 and begins generating predetermined electric signals on the timer output line (TOUT) 68.

The decoder group 22, with the exception of the disabled fifth decoder 36, monitors the predetermined electric signals on the timer output line (TOUT) 68. When the timer 18 reaches a first predetermined time and generates a first predetermined electric signal, the first decoder 28 within the decoder group 22 generates a first control output signal. The first control output signal sets the first flip-flop 44 to generate a predetermined electric signal to activate the first logic circuit 48 within the logic circuits 16. The first logic circuit 48 executes at least one logic task that is performed as part of the operation initiated by the state machine 12.

When the timer 18 reaches a second predetermined time and generates a second predetermined electric signal, the logic task has executed and the second decoder 30 within the decoder group 22 generates a second control output signal that resets the flip-flop 44 thereby deactivating the first logic circuit 48. This process continues until the timer reaches a fourth predetermined time and generates a fourth predetermined electric signal that activates the fourth decoder 34 to generate a fourth control output that deactivates the second logic circuit 50 in the logic circuits 16.

At this time, all of the logic tasks associated with the first logic circuit 48 and the second logic circuit 50 have been completed automatically and the operation has been performed. The electric signals from the state machine 12 previously set forth have continued conducting throughout the performance of the operation thereby allowing the logic circuits 16 to be controlled by the decoder group 22 based on the predetermined times from the timer 18. When the last logic task associated the second logic circuit 50 is completed, the electric signals from the state machine 12 stop conducting on the timer enable line (TE) 60, the control enable bar line (CEB) 62 and the decoder group activation line (DGA) 64.

When the electric signals from the state machine 12 stop conducting, the one shot 20 resets the timer 18, the first decoder 28 is disabled, the fifth decoder 36 is enabled and the first and second flip-flops (44, 46) are reset. In addition, the decoder group 22 is deactivated. As previously set forth, since the state machine 12 only initiates and concludes the operation in the embedded mode, the automatic execution of the logic tasks within the logic circuits 16 when the timer 18 reaches the predetermined times allow the uninterrupted completion of the logic tasks associated with the operation.

Those skilled in the art would recognize that the embedded and test mode timer circuit 14 and logic circuits 16 illustrated in FIG. 2 is not representative of the plurality of operations that can be performed by the flash memory 10. The number of decoders in the decoder group 22, NOR gates in the NOR gate group 24, flip-flops in the flip-flop group 26 and logic circuits 16 required to complete an operation can vary widely. In addition, since each operation requires a dedicated decoder group 22 and associated logic circuits 16, the block diagram of FIG. 2 does not represent any single operation. Those skilled in the art would recognize that FIG. 2 is illustrative of the operation of the preferred embodiment in a general sense and should not be construed as a limitation on the present invention.

In the preferred embodiment, when the flash memory 10 is operated in a test mode, the state machine 12 receives an instruction set to enter the test mode to perform an operation such as read, program, program verify, erase or erase verify. Similar to the embedded mode, an electric signal generated by the state machine 12 begins conducting on the timer enable line (TE) 60, the control enable bar line (CEB) 62 and the decoder group activation line (DGA) 64. The electric signals enable and reset the timer 18, activate the decoder group 22 that is specific to the respective operation to be performed during the test mode as well as enable the first decoder 28 and disable the fifth decoder 36. However, the second decoder 30, the third decoder 36 and the fourth decoder 34 are disabled by the electric signal on the test mode line (TMODE) 66 that stops conducting when the test mode is entered.

Similar to the embedded mode, when the timer 18 reaches the first predetermined time, the first decoder 28 within the decoder group 22 generates the first control output signal in an automated fashion. The first control output signal from the first decoder 28 sets the first flip-flop 44 to generate a predetermined electric signal to activate the first logic circuit 48 within the logic circuits 16. The first logic circuit 48 executes at least one logic task at the beginning of the requested operation during the test mode. When the timer 18 reaches the second predetermined time, the second decoder 30 is disabled and does not generate the second control output signal to deactivate the first logic circuit 48 as in the embedded mode. Instead, execution of the operation is suspended at the logic tasks in the middle of the operation during the test mode since the third and fourth decoders (32, 34), respectively, are also disabled and will ignore the predetermined electric signals generated by the timer 18 on the timer output line (TOUT) 68.

When the user elects to manually execute the logic tasks in the middle of the operation, the state machine 12 receives externally controlled instruction sets and stops conducting an electric signal on the control enable bar line (CEB) 62. When this occurs, the first flip-flop 44 within the embedded and test mode timer 14 is reset thereby deactivating the first logic circuit 48. In addition, the logic tasks at the end of the operation associated with the second logic circuit 50 are activated.

The falling edge of the non-conducting electric signal on the control enable bar line (CEB) 62 triggers the one shot 20 thereby resetting the timer 18. In addition, the non-conducting electric signal on the control enable bar line (CEB) 62 sets the second flip-flop 46, disables the first decoder 28 and enables the fifth decoder 36. Since the first, second, third and fourth decoders (28, 30, 32, 34) are all disabled, only the fifth decoder 36 monitors the predetermined electric signals generated by the timer 18 on the timer output line (TOUT) 68. When the timer 18 reaches a fifth predetermined time and generates a fifth predetermined electric signal, the fifth decoder 36 generates a fifth control output that resets the second flip-flop 46 thereby completing at least one logic task associated with the second logic circuit 50 automatically.

The operation of the fifth decoder 36 also signals to the state machine 12 that the operation within the test mode has been performed and the state machine 12 stops conducting on the timer enable line (TE) 60 thereby deactivating the timer 18. In addition, the state machine 12 begins conducting an electric signal on the test mode line (TMODE) 66 and stops conducting on the decoder group activation line (DGA) 64 thereby deactivating the decoder group 22.

By utilizing the same decoder group 22 to perform an operation in both the embedded mode and in a test mode, complexity of testing is greatly reduced. Since the timer within the embedded and test mode timer circuit 14 directs execution of the logic tasks within the logic circuits 16 automatically during the embedded mode and during the plurality of test modes, test equipment needed during the test modes is simplified. When a portion of the embedded and test mode timer circuit 14 that directs the logic circuits 16 to execute logic tasks automatically in the embedded mode is disabled during a test mode, the user is provided manual control of the logic circuits 16 via the state machine 12. This allows the testing during the test mode operation to be greatly simplified such that no complex and sophisticated test equipment is required as in the prior art.

In the preferred embodiment, the timing for the logic tasks where timing is critical, or must occur very quickly, is the same in both the embedded mode and during the test modes. Since the timing is the same, changes to the flash memory 10 that affect the operation in the embedded mode also advantageously affect the operation in the test modes. During an operation in a test mode, execution of logic tasks where timing is critical occurs automatically since the logic task(s) at the beginning of the operation is automatically directed by the embedded and test mode timer circuit 14.

The user controls the execution of logic tasks where timing is not critical in the middle of the operation and the operation will be suspended until this logic task(s) is manually executed. Following completion of the logic task(s) in the middle of the operation, the embedded and test mode timer circuit 14 automatically directs the execution of the logic task(s) where timing is critical at the end of operation and the operation is completed. During embedded mode when an operation is initiated, the embedded and test mode timer circuit 14 automatically executes all the logic tasks in the logic circuits 16 to complete the operation.

While the invention has been described in its currently best known modes of operation and embodiments, other modes and embodiments of the invention will be apparent to those skilled in the art. It is the following claims, including all equivalents that are intended to define the spirit and scope of the invention.

What is claimed is:

1. A memory device capable of operating in an embedded mode and a plurality of test modes, comprising:
   a state machine;
   an embedded mode circuit and test mode timer circuit electrically coupled with said state machine, wherein said embedded mode circuit and said test mode timer circuit are activated by said state machine, both said embedded mode circuit and said test mode timer circuit residing on said memory device; and
   at least one logic circuit electrically coupled with said embedded mode circuit and said test mode timer circuit, wherein said at least one logic circuit is directed by said embedded mode circuit and said test mode timer circuit.

2. The memory device of claim 1, wherein said embedded mode circuit and said test mode timer circuit includes a timer and a plurality of decoders.

3. The memory device of claim 1, wherein said at least one logic circuit is directed during said embedded mode by said embedded mode circuit and said test mode timer circuit at a plurality of predetermined times.

4. The memory device of claim 3, wherein said at least one logic circuit is controlled by a decoder group.

5. The memory device of claim 1, wherein said at least one logic circuit is directed during said plurality of test modes by said embedded mode circuit and said test mode timer circuit at a plurality of predetermined times and when said embedded mode circuit and said test mode timer circuit are manually directed.

6. The memory device of claim 5, wherein said at least one logic circuit is controlled by a decoder group and by said state machine.

7. The memory device of claim 1, wherein said at least one logic circuit performs a plurality of logic tasks.

8. An embedded mode circuit and said test mode timer circuit both residing on a memory device, said embedded mode circuit and said test mode timer circuit for directing logic circuits in an embedded mode and a plurality of test modes in a memory device, comprising:
   a timer, wherein said timer generates a plurality of predetermined times;
   a plurality of decoders electrically coupled with said timer;
   a decoder group within said plurality of decoders wherein said decoder group is activated to monitor said plurality of predetermined times and generate a plurality of control signals to direct at least one logic circuit electrically coupled with said decoder group.

9. The embedded mode circuit and said test mode timer circuit of claim 8, wherein said timer is a binary counter.

10. The embedded mode circuit and said test mode timer circuit of claim 8, wherein said timer is reset by a one shot located within said embedded and test mode timer circuit.

11. The embedded mode circuit and said test mode timer circuit of claim 8, wherein at least one flip-flop is electrically coupled with said decoder group and said at least one logic circuit is activated by said decoder group to direct said at least one logic circuit during said embedded mode.

12. The embedded mode circuit and said test mode timer circuit of claim 8, wherein at least one flip-flop is electrically coupled with said decoder group and said at least one logic circuit is activated by said decoder group or by a state machine electrically coupled with said at least one flip-flop to direct said at least one logic circuit during said plurality of test modes.

13. The embedded mode circuit and said test mode timer circuit of claim 8, wherein said plurality of test modes include a program, a program verify, an erase, an erase verify or a read operation.

14. A method of executing an operation in an embedded mode and in a plurality of test modes in a memory device, comprising the steps of:
   initiating an operation with a state machine;
   activating an embedded mode circuit and test mode timer circuit with said state machine to execute said operation, both said embedded mode circuit and said test mode timer circuit residing on said memory device; and
   directing at least one logic circuit electrically coupled with said embedded mode circuit and said test mode timer circuit to complete said operation.

15. The method of claim 14, wherein said embedded mode circuit and said test mode timer circuit includes a timer and a plurality of decoders.

16. The, method of claim 14, wherein said at least one logic circuit is directed during said embedded mode by said embedded mode circuit and said test mode timer circuit at a plurality of predetermined times.

17. The method of claim 16, wherein said at least one logic circuit is controlled by a decoder group.

18. The method of claim 14, wherein said at least one logic circuit is directed during said plurality of test modes by said embedded mode circuit and said test mode timer circuit at a plurality of predetermined times and when said embedded mode circuit and said test mode timer circuit are manually directed.

19. The method of claim 18, wherein said at least one logic circuit is controlled by a decoder group and by said state machine.

20. The method of claim 14, wherein said at least one logic circuit performs a plurality of logic tasks.

* * * * *